United States Patent
Trimberger et al.

(10) Patent No.: US 7,143,329 B1
(45) Date of Patent: Nov. 28, 2006

(54) FPGA CONFIGURATION MEMORY WITH BUILT-IN ERROR CORRECTION MECHANISM

(75) Inventors: Stephen M. Trimberger, San Jose, CA (US); Austin H. Lesea, Los Gatos, CA (US); Derek R. Curd, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 330 days.

(21) Appl. No.: 10/796,475

(22) Filed: Mar. 9, 2004

Related U.S. Application Data

(63) Continuation-in-part of application No. 09/797,138, filed on Feb. 28, 2001.

(51) Int. Cl.
 *G06F 11/00* (2006.01)
 *G06F 11/30* (2006.01)
 *G08C 25/00* (2006.01)
 *H03M 13/00* (2006.01)
 *H04L 1/00* (2006.01)

(52) U.S. Cl. .................. 714/746; 714/725; 714/766; 714/758; 326/38; 326/39; 716/3; 716/4; 716/16; 716/19

(58) Field of Classification Search ............... 714/725, 714/766, 782–785, 758–759, 746; 326/38–39
See application file for complete search history.

(56) References Cited

U.S. PATENT DOCUMENTS

| | | | |
|---|---|---|---|
| 4,380,811 A * | 4/1983 | Gotze et al. ............... | 714/710 |
| 5,943,488 A * | 8/1999 | Raza ............................ | 716/19 |
| 6,216,248 B1 * | 4/2001 | Mc Connell et al. ........ | 714/763 |
| 6,304,101 B1 * | 10/2001 | Nishihara ..................... | 326/41 |
| 6,378,101 B1 * | 4/2002 | Sinha et al. ................. | 714/755 |
| 6,574,761 B1 * | 6/2003 | Abramovici et al. ........ | 714/725 |
| 6,694,464 B1 * | 2/2004 | Quayle et al. ............... | 714/725 |
| 6,701,480 B1 * | 3/2004 | Karpuszka et al. ......... | 714/764 |
| 6,839,873 B1 * | 1/2005 | Moore .......................... | 714/725 |
| 6,938,193 B1 * | 8/2005 | Honda ........................ | 714/720 |

OTHER PUBLICATIONS

U.S. Appl. No. 10/787,683, filed Feb. 26, 2004, Trimberger.
Derek R. Curd; XAPP673 (v1.01) Application Note; "Single Event Upset (SEU) Detection and Correction in Virtex-II Pro Devices"; Aug. 27, 2003; available from Xilinx, Inc., 2100 Logic Drive, San Jose, CA 95124; pp. 1-12.

* cited by examiner

*Primary Examiner*—Guy Lamarre
*Assistant Examiner*—Saqib J. Siddiqui
(74) *Attorney, Agent, or Firm*—LeRoy D. Maunu

(57) ABSTRACT

A system and method are disclosed for error correction in a programmable logic device (PLD). A frame circuit retrieves data from each column of configuration memory of the PLD, and a check memory stores of a plurality of check words. A buffer circuit is coupled to the check memory and to the frame circuit. The buffer circuit assembles blocks of data from data retrieved by the frame circuit and from corresponding check words in the check memory. A plurality of storage elements are provided for storage of status information. A check circuit is coupled to the storage elements and to the buffer circuit. Each block is checked by the check circuit using an error correcting code, and data indicating detected errors is stored in the storage elements.

29 Claims, 13 Drawing Sheets

FPGA CONFIGURATION MEMORY WITH BUILT-IN ERROR CORRECTION MECHANISM

FIELD OF THE INVENTION

The present invention generally relates to error correction in programmable logic devices.

BACKGROUND OF THE INVENTION

Digital logic can be implemented using several options: discrete logic devices, often called small-scale integrated circuits or SSI, programmable devices such as programmable logic arrays (PLAs) or programmable logic devices (PLDs), masked-programmed gate arrays or cell-based application specific integrated circuits (ASICs), and field programmable gate arrays (FPGAs).

FPGAs are general purpose programmable devices that are customized by the end users. FPGAs are composed of an array of configurable logic blocks that are programmably interconnected. The basic device architecture of an FPGA consists of an array of configurable logic blocks (CLBs) embedded in a configurable interconnect structure and surrounded by configurable I/O blocks (IOBs). An IOB allows signals to be driven off-chip or optionally brought onto the FPGA onto interconnect segments. The IOB can typically perform other functions, such as tri-stating outputs and registering incoming or out-going signals. The configurable interconnect structure allows users to implement multi-level logic designs (multi-level refers to logic in which the output signal of one logic unit provides input to another logic unit and the output of that provides input to another, etc.). An FPGA can support hundreds of thousands of gates of logic operating at system speeds of tens of megahertz. The FPGA is programmed by loading programming data into the memory cells controlling the configurable logic blocks, I/O blocks, and interconnect structure.

Each configurable logic block in the FPGA can include configuration memory cells for controlling the function performed by that logic block. These configuration memory cells can implement a lookup table, control multiplexers, and control other logic elements such as XOR gates and AND gates. A lookup table (LUT) stores a truth table which implements that combinational logic function corresponding to the truth table. Each configurable logic block is associated with an adjacent portion of the interconnect structure. The interconnect structure includes programmable interconnect points which control the connection of wiring segments in the programmable interconnect network of the FPGA. Each programmable interconnect point may be a pass transistor controlled by a configuration memory cell. Wire segments on each side of the pass transistor are either connected or not connected depending on whether the transistor is turned on by the corresponding configuration memory cell.

Configuration is the process of loading a stream of bits containing the program data into the configuration memory cells which control the configurable logic blocks and I/O blocks of the FPGA. The bitstream is loaded into the FPGA serially to minimize the number of pins required for configuration and to reduce the complexity of the interface to external memory. The bitstream is broken into packets of data called frames. As each frame is received, it is shifted through a frame register until the frame register is filled. The data in the frame register of the FPGA are then loaded in parallel into one column of configuration memory cells forming the memory array. (The configuration memory cells which control a configurable logic block typically occupy a two dimensional section of the array.) The configuration memory cells make up the lookup tables and control programmable interconnect points, multiplexers, and other programmable elements of a configurable logic block or I/O block. Following the loading of the first frame, subsequent frames of bitstream data are shifted into the FPGA, and another column of configuration memory cells in the array of CLBs is designated to be loaded with a frame of bitstream data.

Because the functions performed by the logic or I/O blocks are determined by the values of the configuration memory cells, any error in the values could affect the functions. In a FPGA configured to implement a complex design, it is possible that a single error could render the design inoperative. Although the memory cells are normally very reliable, there is a concern that they might be disturbed in a high-radiation or high-temperature environment. Consequently, it is desirable to include in the FPGA an error correction and reporting mechanism.

SUMMARY OF THE INVENTION

The various embodiments of the invention provide a system and method for error correction in a programmable logic device (PLD). In one embodiment, a frame circuit retrieves data from each column of configuration memory of the PLD, and a check memory stores a plurality of check words. A buffer circuit is coupled to the check memory and to the frame circuit. The buffer circuit assembles blocks of data from data retrieved by the frame circuit and from corresponding check words in the check memory. A plurality of storage elements are provided for storage of status information. A check circuit is coupled to the storage elements and to the buffer circuit. Each block is checked by the check circuit using an error correcting code, and data indicating detected errors is stored in the storage elements.

The above summary of the present invention is not intended to describe each disclosed embodiment of the present invention. The figures and detailed description that follow provide additional example embodiments and aspects of the present invention.

BRIEF DESCRIPTION OF THE DRAWINGS

The present invention is illustrated by way of example, and not by way of limitation, in the detailed description and the following figures, in which like reference numerals refer to similar elements.

DETAILED DESCRIPTION OF THE INVENTION

The present invention relates to FPGA error detection and correction systems and methods. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
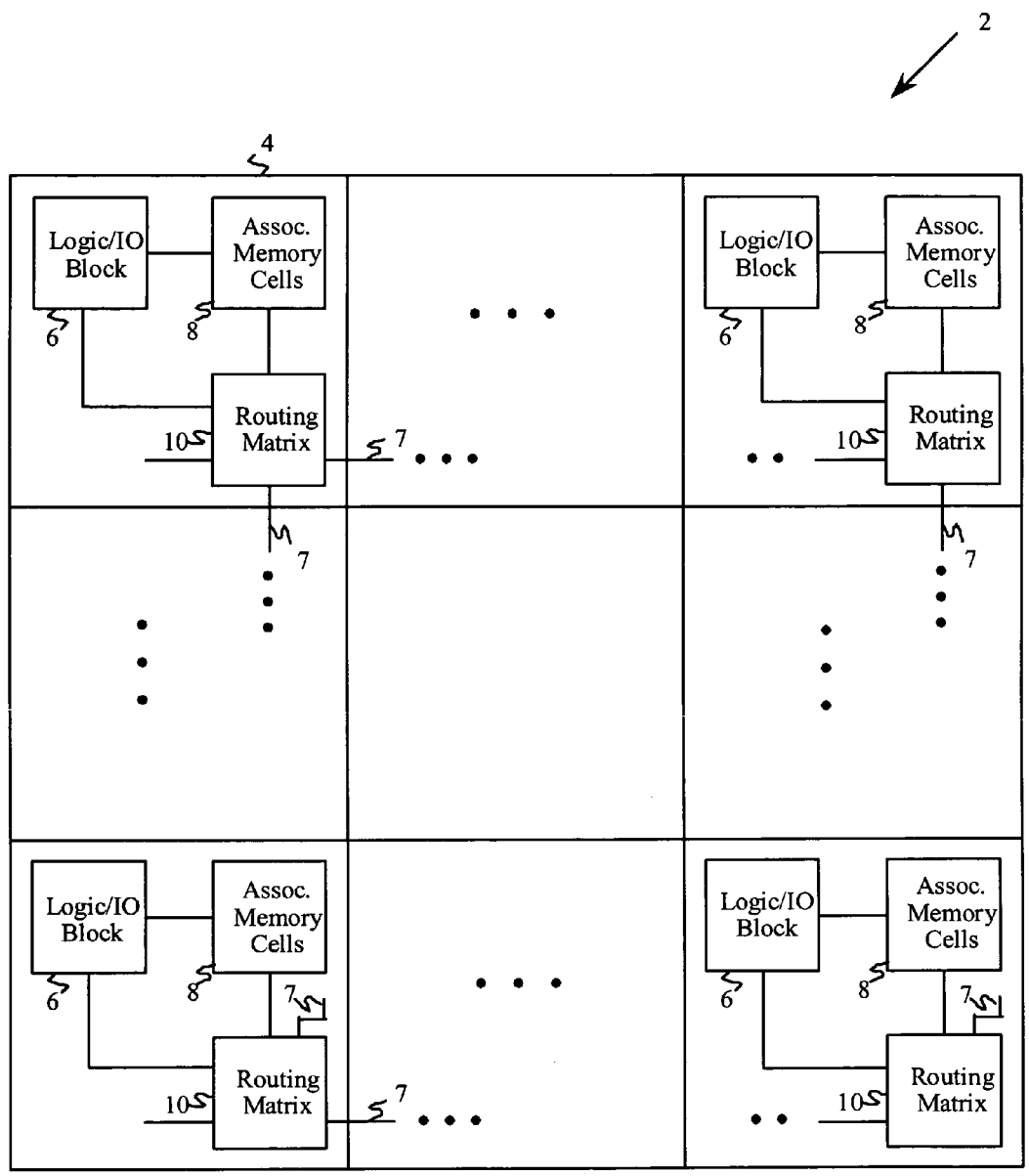
FIG. 1 is a block diagram of an example FPGA.

FIG. 1 shows a schematic diagram of an embodiment of an FPGA 2 on which various embodiments of the invention may be used. FPGA 2 comprises a plurality of CLBs 4. Each CLB 4 in turn comprises a logic/IO block 6, a routing matrix 10 and associated memory cell group 8. Even though FIG. 1 shows block 6, matrix 10 and memory cell group 8 as individual blocks with sharp boundary, they may be physically distributed throughout the CLB. Logic/IO block 6 is a logic and/or input-output block that can be configured to perform one of a variety of logical and/or input-output functions. For example, logic/IO block 6 may be configured to be a wide AND gate decoder, a multi-bit adder, a multi-input combinational function generator, etc. Logic/IO block 6 is configured by storing data in the associated memory cell group 8 for logic/IO block 6. Transistor gates in logic/IO block 6 are coupled to associated memory cell group 8 for being controlled by configuration data that specifies the function logic/IO block 6 is to perform. Routing matrix 10 is used to couple the inputs and outputs of logic/IO block 6 with the inputs and outputs of other logic/IO blocks 6 via a plurality of programmable interconnections 7 for creating complex circuits on FPGA 2. Routing matrix 10 is also coupled to associated memory cell group 8 and is controlled by configuration data that are applied to the control inputs of routing matrix 10 so that the inputs and outputs of logic/IO block 6 are coupled as desired.

Figure 2:
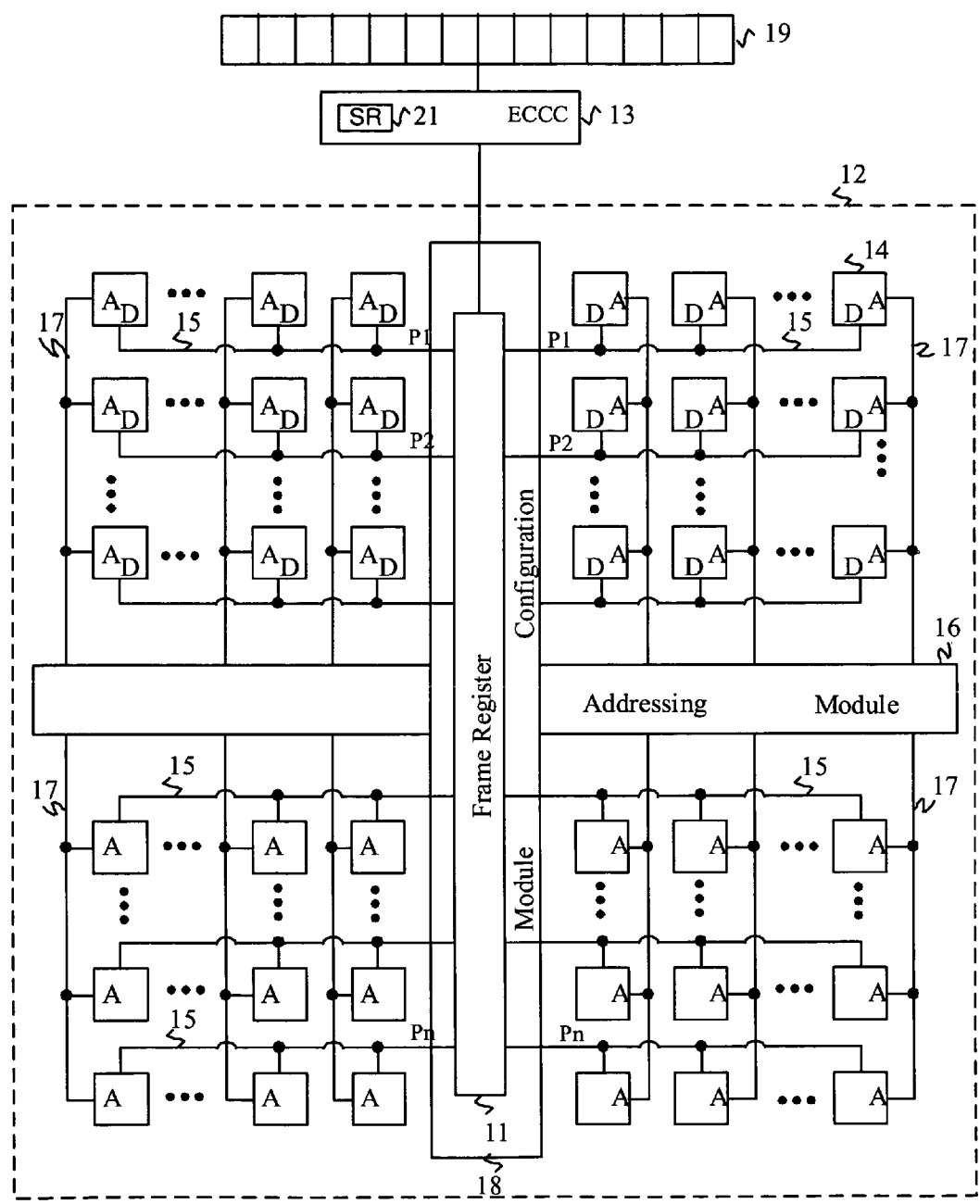
FIG. 2 is a schematic diagram of an error correction system for a configuration memory in accordance with various embodiments of the present invention.

Associated memory cell group 8 shown in FIG. 1 is preferably a group or section of configuration memory cells 14 from an array 12 of memory cells 14 (See FIG. 2). Memory cells 14 are preferably arranged in array 12 in rows and columns. In one embodiment of FPGA 2, logic/IO block 6, routing matrix 10, and associated memory cell group 8 of each CLB 4 are grouped together physically near each other across FPGA 2. This is advantageous because it reduces the amount of wiring needed. These components 6, 8, 10 may, however, be separated from each other or arranged in other configurations without departing from the spirit of the present invention. In any case, the electrical correspondence among components 6, 8, 10 is maintained. Thus, for each CLB 4 of an FPGA 2 there is a specific logic/IO block 6, a specific memory cell group 8, and a specific routing matrix 10. The memory cells 8, however, may be physically grouped together in one large array of memory cells whether or not the other components of each CLB 4 are separated. This large array of memory cells may be either separated from the logic/IO blocks 6 or may be integrated with the logic/IO blocks 6 and routing matrices 10.

Referring now to FIG. 2, a schematic diagram of one embodiment of an error correction system for the configuration memory. This system comprises an array 12 of memory cells 14, an address module 16, a configuration module 18, an error correcting code circuit (ECCC) 13, and an error check memory 19. Circuit 13 and memory 19 are used for detecting and correcting errors in memory cells 14 in array 12. ECCC 13 records status information pertaining to error detection and correction in status register (SR) 21.

Memory cells 14 are arranged in rows and columns. Each memory cell 14 has two inputs. One input, labeled D in FIG. 2, is a data input and is coupled to a frame register 11 of configuration module 18. The other input, labeled A in FIG. 2, is an address input and is coupled to address module 16. A signal applied on address input A controls when data on data input D is written into memory cell 14. In an alternative embodiment, data input D is bidirectional and data may be transferred in either direction between data input D and memory cell 14. In addition, each memory cell 14 has outputs not shown in FIG. 2 that are coupled to the appropriate logic/IO block 6 or routing matrix 10.

Figure 3:
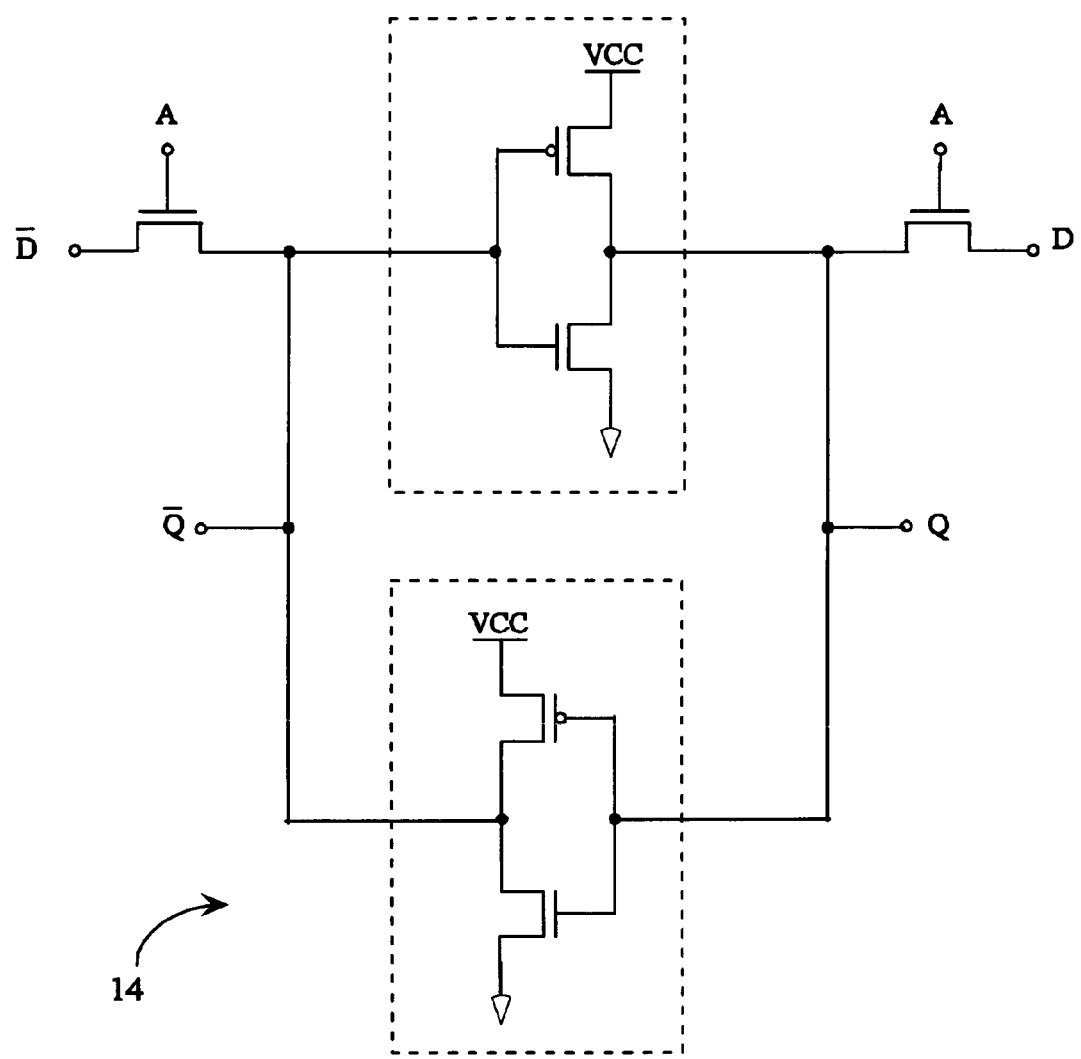
FIG. 3 is a schematic diagram of an example memory cell of configuration memory.

FIG. 3 shows a memory cell 14 with an address input A, a differential data input D, and a differential output Q. Differential output Q is coupled to the gates of transistors in logic/IO block 6 or routing matrix 10. This and other memory cell structures are further discussed in U.S. Pat. No. 5,764,564 which is incorporated herein by reference. Memory cells 14 are preferably static random access memory cells; however, those skilled in the art will realize that memory cells 14 may be implemented with other equivalent circuits such as an array of D-flip-flops or EEPROM cells.

The various embodiments of the present invention also provide a plurality of row buses 15 and column buses 17 for coupling the data inputs and the address inputs, respectively. In the embodiment of FIG. 2, each row bus 15 is coupled to the data input of each memory cell 14 in a row. Thus, there is one row bus 15 for each row of memory cells 14 in array 12. The data inputs for each row of memory cell 14 correspond to the data in frame register 11. Similarly, each column bus 17 is coupled to the address input of each memory cell 14 in a column. There is one column bus 17 for each column of memory cells 14 in array 12. Thus, each time the address signal is asserted on a column bus 17, all the memory cells 14 in that column are written with data stored in frame register 11. Therefore, an entire column of data can be written to array 12 simultaneously when an address is asserted. More details about address module 16 and configuration module 18 will be provided below.

Figure 4:
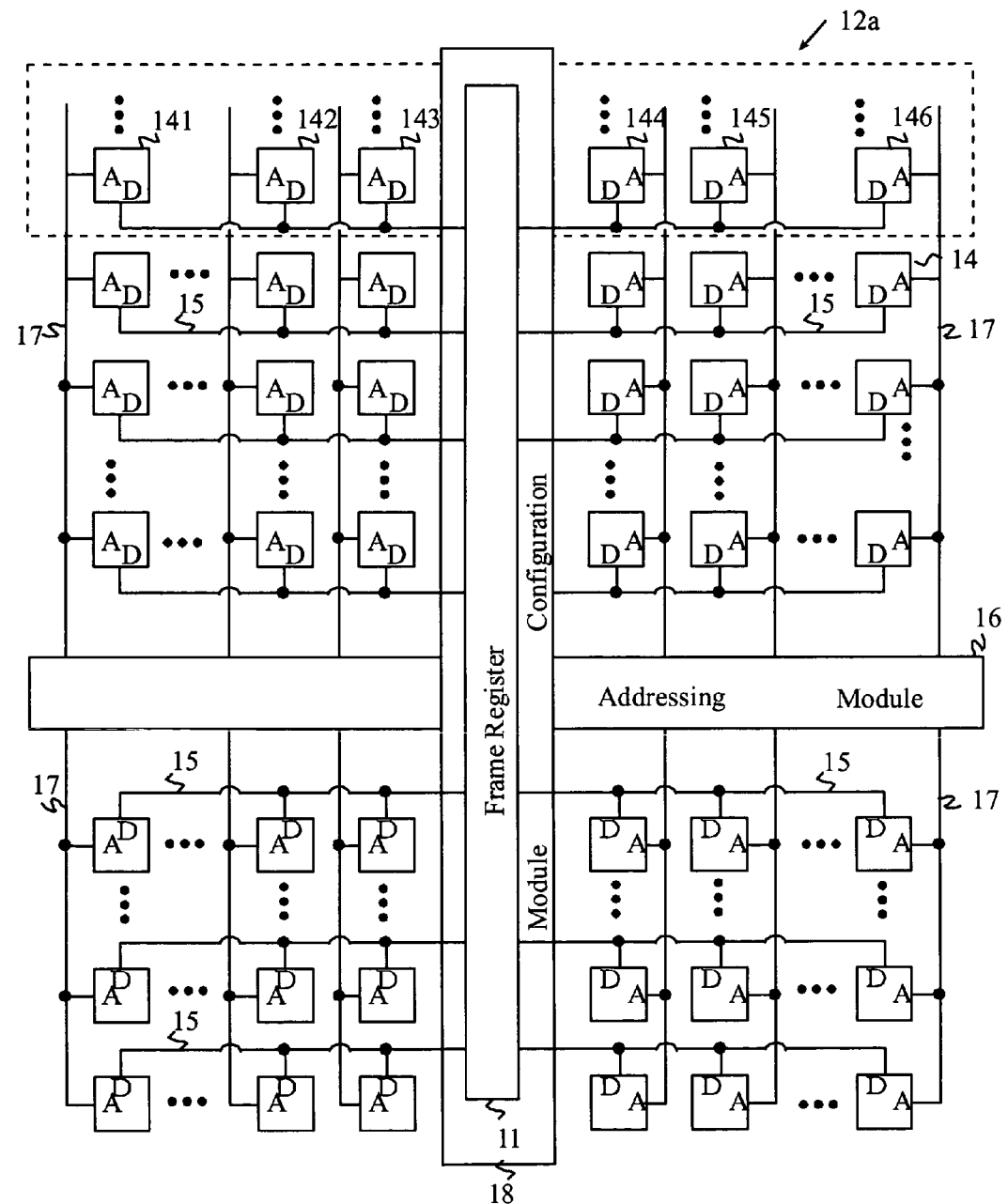
FIG. 4 shows an alternative embodiment of configuration memory.

In one embodiment, the error check words can be introduced into each frame (instead of centrally stored in one location). FIG. 4 shows such an embodiment of an array 12a. A plurality of bits for check words, such as bits 141–146, are added to the regular array. Typically, each frame includes a plurality of such check bits to create a check word for error correction. This plurality of distributed check bits functions in the same way as check memory 19. In this embodiment, all the bits in a frame, including the bits of the error check word, can be written at the same time.

Figure 5:
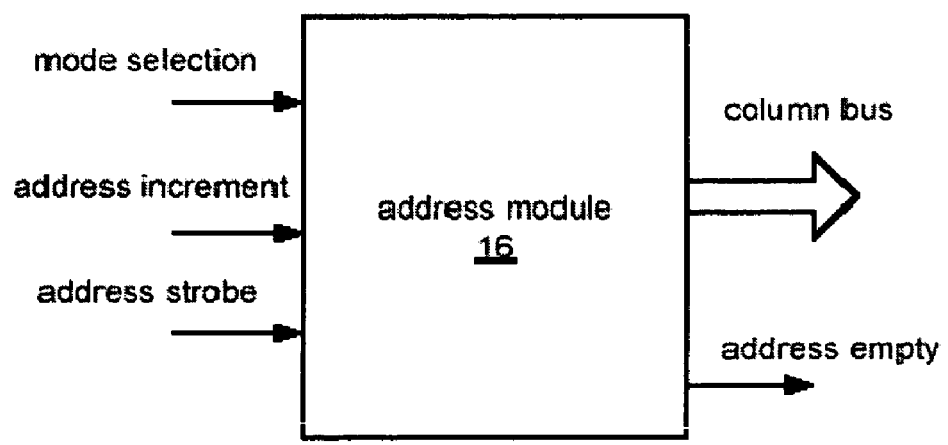
FIG. 5 is a block diagram showing the input and output signals of an address module.

The structure and operation of address module 16 are now described in detail. Address module 16 specifies the column of array 12 that is to be written with data supplied from configuration module 18, or read with data sent to configuration module 18. As shown in FIG. 5, address module 16 preferably accepts a mode selection input, an address increment input, and an address strobe input. The mode selection input directs address module 16 to operate in one of two modes: a configuration mode (active during configuration) and an error correction mode (active after configuration for error detection and correction). Address module 16 generates an address empty output and a column bus. Address module 16 preferably has a number of stages equal in number to the number of columns in array 12. Each stage stores an enable bit that specifies whether a particular column is to be addressed. Since typically only one column is addressed at a time, only one stage contains an active enable bit. Each of the plurality of lines in the column bus is coupled to the address input of memory cells 14 in a respective column of array 12. For example, a first column bus output of address module 16 is coupled to the address inputs of memory cells 14 in the first column of array 12. A second column bus output of address module 16 is coupled to the address inputs of memory cells 14 in the second column of array 12. Each subsequent column of memory cells 14 of array 12 is similarly coupled to a respective column bus output of address module 16. The address increment input provides a way of shifting the address enable bits through the stages of address module 16.

In the configuration mode, each column of array 12 is active once. Thus, each memory cell 14 is configured once. After all the columns have been addressed, address module 16 generates the address empty output to indicate the end of configuration. In the error correction mode, for one embodiment one column after another is active in a continuous sequential manner because the memory cells need to be verified repeatedly. Thus, no address empty output is generated.

Address module 16 accepts the address strobe input generated by control unit 24*a* for controlling whether the address lines in the column bus are asserted. This is advantageous because the memory cells 14 of array 12 will be, accessed only when the address strobe signal is applied.

Figure 6:
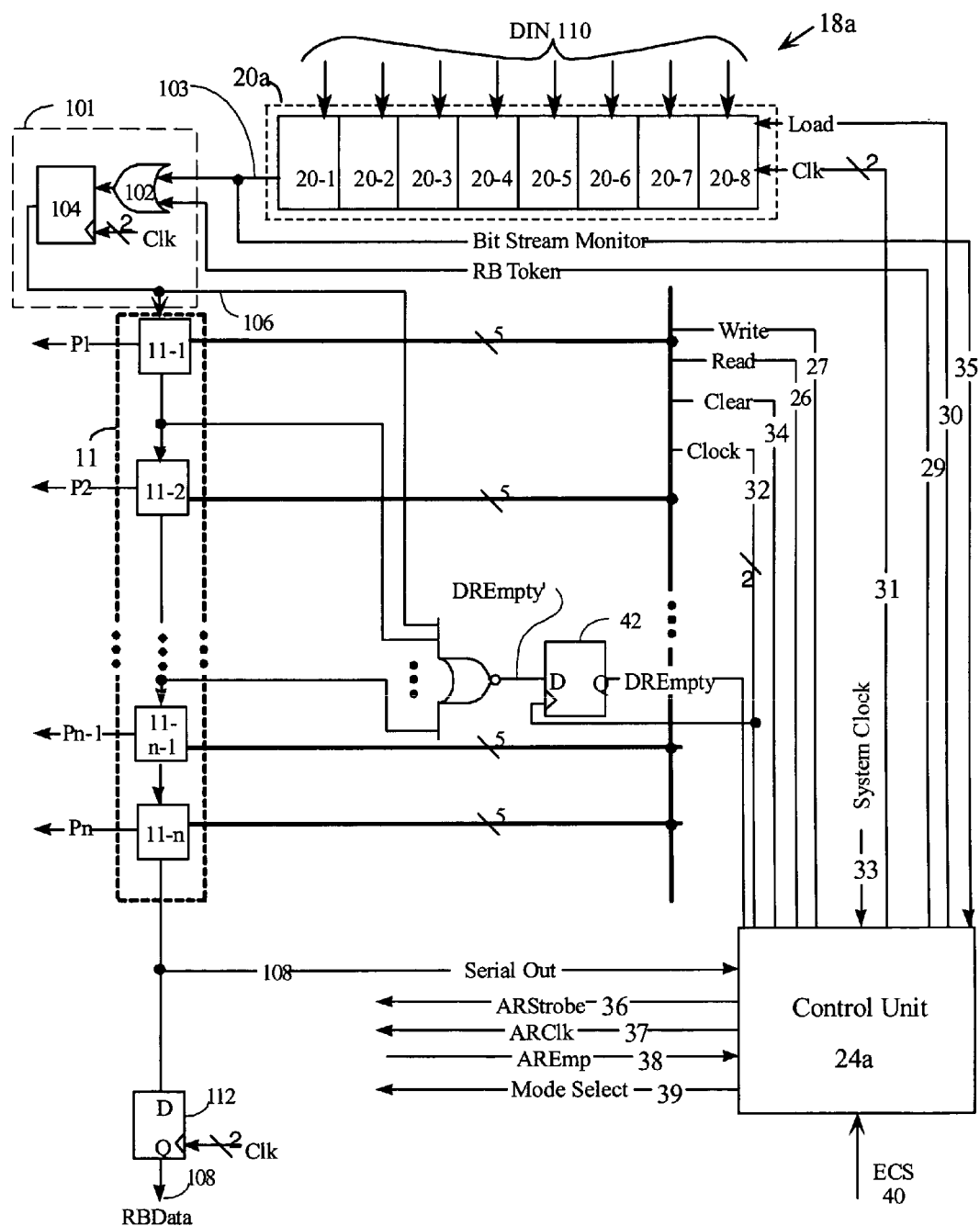
FIG. 6 is a schematic diagram showing an example configuration module.

The structure and operation of configuration module 18 are now described in detail. Referring now to FIG. 6, a schematic diagram is shown for a configuration module 18*a* that can be used in the present invention. Configuration module 18*a* comprises a data input register 20*a*, a read-back select unit 101, a shift frame register 11, a readback data flip flop 112, and a control unit 24*a*.

Data input register 20*a* is a parallel in, serial out shift register having eight stages 20-1 through 20-8. Data input register 20*a* has eight data input terminals 110, two clock input terminals 31, a load input terminal 30, and a serial output terminal 103. The data to be stored in memory cells 14 are applied to the eight data input terminals 110 for loading. The data are loaded in parallel, eight bits at a time, through the input terminals of data input register 20*a*. The data are then serially transferred out of data input register 20*a* onto terminal 103. The output of a first stage 20-1 is the serial output of data input register 20*a*. It should be noted that register 20*a* may have more (or less) than eight stages.

Data are transferred out of data input register 20*a* through OR gate 102 into flip flop 104 and from there into shift frame register 11. Shift frame register 11 is a serial-in, parallel-out shift register and comprises a plurality of stages 11-1 through 11-*n*. Shift frame register 11 receives a two-phase clock signal on a bus 32, a clear input signal on line 34, a data input signal on line 106, and provides a serial data output signal (Serial Out) on line 108 and a plurality of parallel bidirectional data signals on lines P1 through P*n*. There is a stage in shift frame register 11 for each row of memory cells 14 in array 12. Stages 11-1 through 11-*n* shift data one stage down for each cycle of the clock signal on bus 32. The data input terminal of shift frame register 11 is coupled to line 106. As shown in FIG. 2, each of the plurality of parallel data bidirectional lines P1 through P*n* is coupled to a row of memory cells 14 in array 12. The serial data output of shift frame register 11 on line 108 is coupled to control unit 24*a*.

Control unit 24*a* comprises a state machine which generates a plurality of signals to control the operation of configuration module 18*a*. The signals generated by control unit 24*a* include: a two-phase clock signal Clk on bus 31 coupled to the clock input terminals of each stage in data input register 20*a*, to readback select unit 101 and to readback data flip flop 112; a load signal (Load) on line 30 coupled to the load input terminal of data input register 20*a*; a second two-phase clock signal (Clock) on bus 32 coupled to the clock input terminals of shift frame register 11; and a clear signal (Clear) on line 34 coupled to the clear input terminals of stages of shift frame register 11 for clearing shift frame register 11. In one embodiment of configuration module 18*a*, the first clock signal (Clk) may be identical to the second clock signal (Clock).

Those skilled in the art will recognize how to construct control unit 24*a* from the functional description that follows.

To place shift frame register into configuration mode, control unit 24*a* applies a high signal on write line 27. This allows shift frame register 11 to shift data. The write signal remains high and the read signal remains low during the entire configuration sequence. Control unit 24*a* also sets a mode selection signal 39 into one value (e.g., a "high" value). This signal is coupled to the mode selection input of address module 16 to indicate that configuration mode is in progress.

Before data are loaded into shift frame register 11, shift frame register 11 is cleared to logic "0" by asserting a Clear signal on line 34. The first bit loaded into the first stage 20-1 of data input register 20*a* is preferably a control bit ("1") and the remaining bits loaded into stages 20-2 through 20-8 are the first seven bits data to be loaded into memory cells 14. Shift frame register 11 is then clocked to load the control bit from first stage 20-1 of data input register 20*a* through readback select unit 101 to first stage 11-1 of shift frame register 11. The remaining bits loaded into data input register 20*a* are serially shifted into shift frame register 11 by clocking data input register 20*a*, readback select unit 101, and frame shift register 11 seven more times. This process of loading and serially shifting is repeated once for each eight rows of memory cells 14 in array 12. For example, this process would be repeated at least three times if there were twenty-four rows in array 12.

When control unit 24*a* shifts the control bit out of the last stage 11-*n* of shift frame register 11, control unit 24*a* recognizes that shift frame register 11 is fully loaded and that the data may be transferred to the column of memory cells 14 of array 12. Control unit 24*a* then applies an address strobe signal on line 36, to store the data held in shift frame register 11 into a column of memory cells 14 in array 12. This strobe signal is applied to the address strobe input of address module 16. Control unit 24*a* continues to assert the strobe signal until control unit 24*a* detects a control bit on bit stream monitor line 35 which connects to the output terminal of data input register 20*a*. Control unit 24*a* then applies the address clock signal on line 37. This signal is connected to the address increment input of address module 16, and it causes address module 16 to advance to the next column. When all the columns in array 12 have been loaded, address module 16 returns a high AREmp signal on its address empty output. This signal is coupled to line 38 to indicate that address module 16 is empty and the entire array 12 has been loaded.

Figure 7:
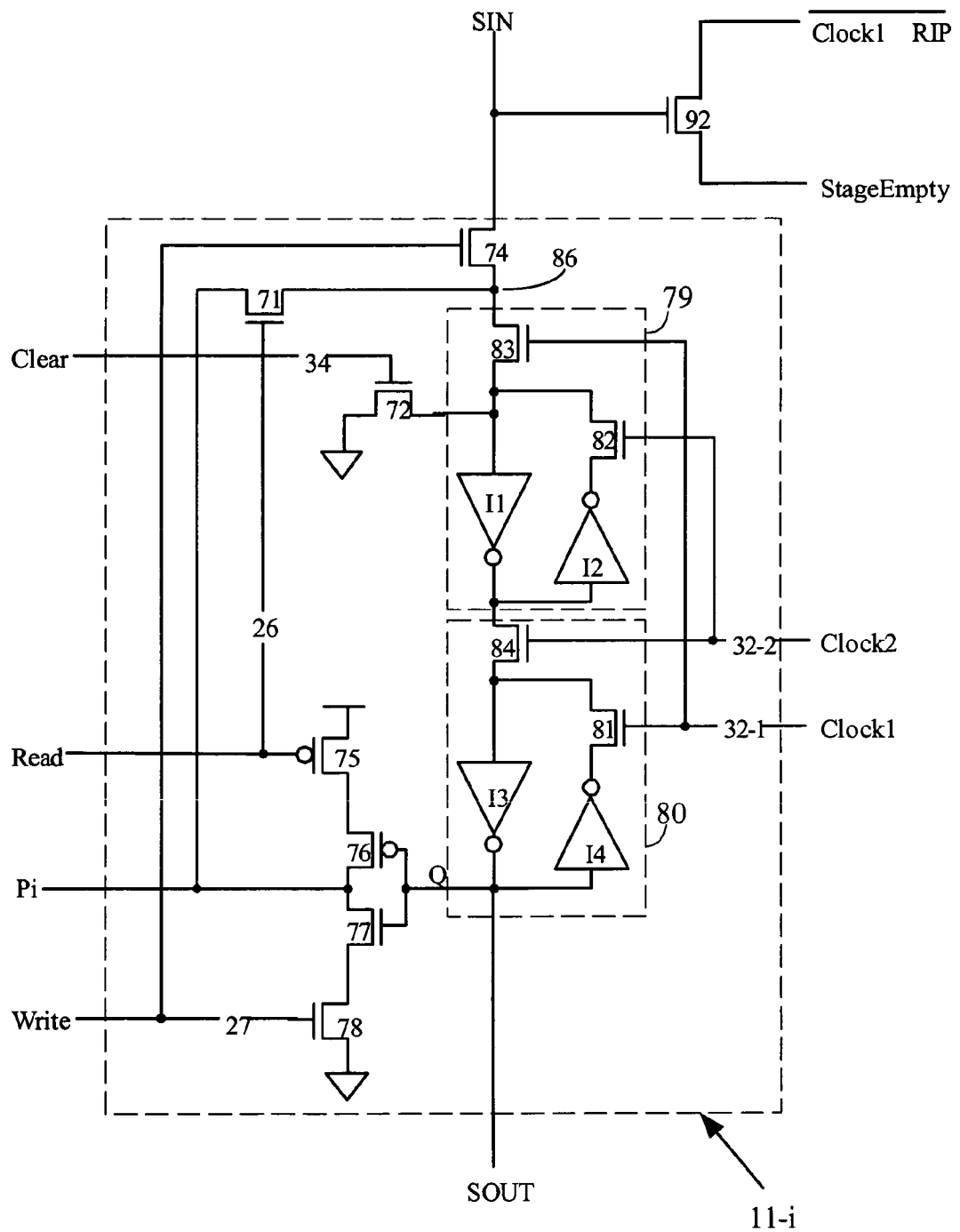
FIG. 7 is a schematic diagram showing a stage of a shift frame register of the configuration module.

Configuration module 18a also allows for reading back data from the array 12. The data read back are used for error correction. In this mode of operation, the mode selection signal on line 39 is set at a value (e.g., logic "low") that is opposite to the configuration mode. A bit, such as bit 11-i, of shift frame register 11 is shown in detail in FIG. 7 to further describe this aspect of the invention. Before reading back data, shift frame register 11 is cleared with a high signal on line 34. At the same time, a high token signal RBToken is loaded on line 29 through OR gate 102 into flip flop 104. The read signal on line 26 is brought low and the write signal on line 27 is brought high, which, as can be seen in FIG. 7, precharges line Pi (represents lines P1 through Pn) to logic high. The read signal on line 26 is then brought high and the write signal on line 27 is brought low, which turns off the power to transistors 75 through 78, turns off transistor 74, and turns on transistor 71. A high address strobe signal on line 36 applies data from the addressed column on array 12 to lines P1 through Pn. When clock signal Clk1 (on line 32-1 of 2-bit bus 32) goes high, line Pi drives the input terminal 86 of master latch 79 and the data value is stored in master latch 79. The address strobe signal on line 36 is then brought low and Clk1 is brought low. When Clk2 goes high, the data bit shifts to slave latch 80.

During this time, the low write signal on line 27 has held transistor 74 off so that data do not shift along the shift register. The shift register is now loaded with one bit for each row in the addressed column, and the next operation will be to shift this column of data out of the shift register. Next, the read signal on line 26 is brought low and the write signal on line 27 is brought high so that data shift from one stage to the next in shift frame register 11. Clk1 and Clk2 alternately are brought high (with non-overlapping clock signals) so that data shift downward and out onto line RBData 108. Shifting continues until the column of data is shifted entirely out. Completion of shifting is detected when the DREmpty signal appears at the output of register 42. Another column is addressed, loaded, and shifted and the process is repeated until all columns have been shifted out.

In one embodiment of the present invention, the data on line RBData 108 is coupled to ECCC 13, which, together with the stored check words, determines whether there is any error in memory cells 14. If correctable errors are discovered, ECCC 13 corrects the error, and delivers the corrected data to data input register 20a of configuration module 18a. ECCC 13 also generates an error correction signal 40 (ECS) and applies it to control unit 24a of configuration module 18a. Control unit 24a will then transfer the data to shift frame register 11 for loading back to the corresponding memory cells 14.

Figure 8:
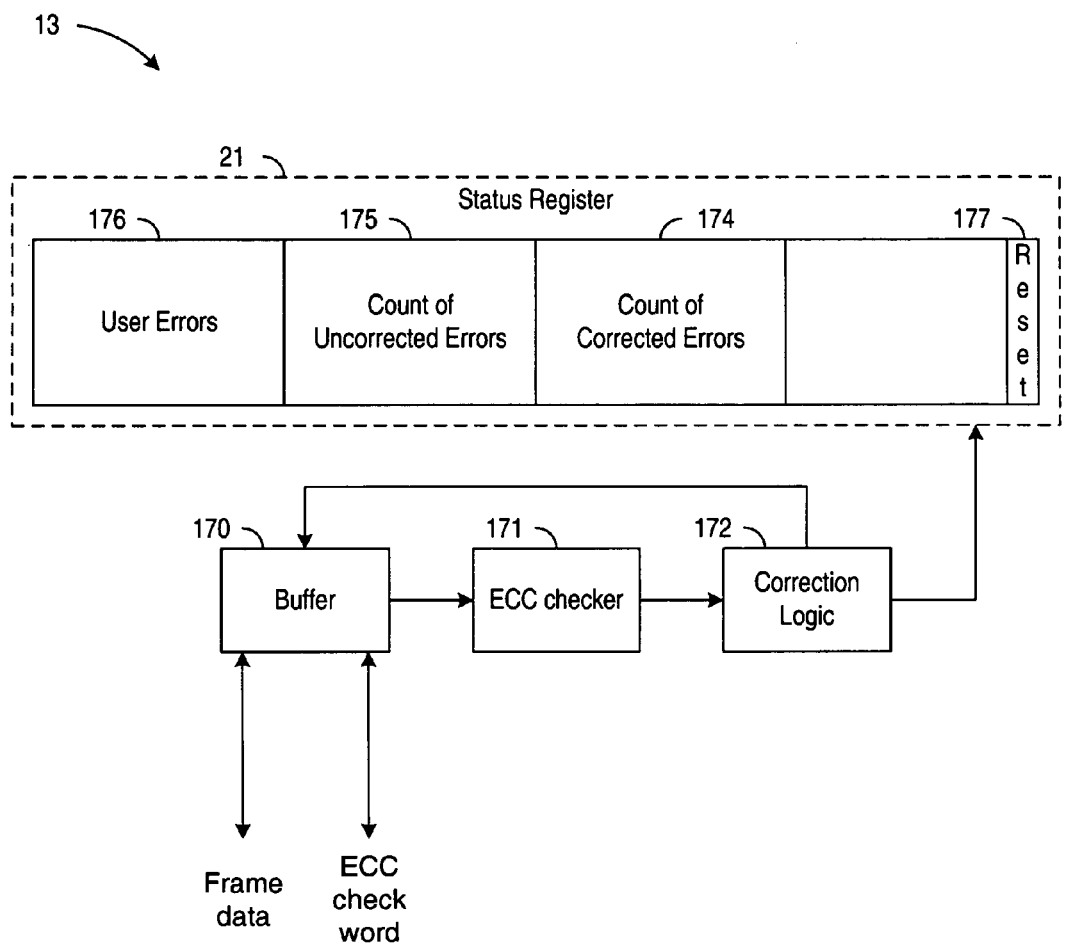
FIG. 8 shows an error correcting code circuit in accordance with various embodiments of the invention.

The structure and operation of error correcting code circuit (ECCC) 13 are now described in detail. Referring now to FIG. 8, a block diagram is shown for the ECCC 13 that can be with various embodiments of the present invention. ECCC 13 comprises a buffer 170, an ECC checker 171, correction logic 172, and a status resister 21.

The frame data to be checked and possibly corrected by the error correcting code is received from configuration memory by the buffer 170. Buffer 170 is used to convert the size of configuration data from frames to the data size needed by the error correcting code. The buffer 170 is also used to assemble the blocks that are checked by the checker 171 from the converted data and the check word for the block.

Because the chosen error correcting code may differ in length from that of a frame, "blocks" of configuration data are assembled to be checked for errors. The frame size is dependent upon the physical size of the FPGA whereas the data size needed by the error correcting code (ECC) is dependent upon the length of the chosen ECC. In one embodiment the frame size may be equal to the size of the ECC, and the buffer 170 need not convert data sizes. In another embodiment, the size of a frame may be made to match the ECC by padding the frame with constant data. In yet another embodiment the optionally padded frame may be partitioned by the buffer 170 into a number of sections with each section matching the size of the ECC. In another embodiment, the frame data arrives serially one bit at a time, and checker 171 consumes one bit at a time.

After converting the configuration data to the appropriate size, buffer 170 creates blocks by appending the check word for the block to the converted data. In one embodiment, as the blocks are assembled the corresponding check words are fetched from sequential locations in check memory 19 (FIG. 2) by the buffer 170. In another embodiment check memory 19 is located within dedicated configuration memory and so the check words arrive included in the frame data.

ECC checker 171 uses a block ECC to check for errors. Each block checked by the checker 171 is composed of an information word and a check word. The information word (the block data) contains the frame data that is protected by the ECC. The check word, previously generated from the block data, and the current block data are checked for any errors of changed block bits. Errors may be in the block data or the check word, or both.

In one embodiment the detection of any errors by checker 171 is performed by recalculating the check word for the ECC and detecting an error when the recalculated check word is different from the check word from check memory 19. This embodiment has the advantage that a check word generator used to initialize check memory 19 during FPGA configuration may also be used by the checker 171. In this embodiment separate logic may be used for the correction logic 172. Because errors may be expected to be infrequent, the correction logic 172 may be implemented with slower logic, thereby permitting a reduction in size of the correction logic 172. In another embodiment the checker 171 uses a parity check matrix for the ECC to produce a syndrome. An error is detected by the checker 171 when the syndrome is non-zero.

The correction logic 172 classifies the type of error detected by the checker 171. For certain ECC, some detected errors can be corrected while other detected errors cannot be corrected. So the correction logic 172 classifies each detected error as either a correctable error or an uncorrectable error. For example a Bose-Chaudhury-Hocquenghem (BCH) code can correct 1 and 2 bit errors and detect but not correct 3 bit errors. The error classification is sent to the status register 21 for logging. For correctable errors, the correction logic 172 corrects the errors and supplies the corrected block data and corrected check word to the buffer 170. The buffer 170 then returns the corrected block data to configuration memory and the corrected check word to check memory.

The status register 21 is used for reporting the detected errors. In one embodiment the status register is a 32 bit register with 8 bit fields for corrected errors 174, uncorrected errors 175, and user errors 176. Each of fields 174–176 is an 8 bit saturating counter for counting the respective errors. The counters saturate to prevent overflow by stopping at the maximum count of 255 errors. The user errors field 176 may be used by configured user logic to track user error information. Each of fields 174–176 is cleared upon setting the reset bit 177. By periodically reading and clearing the error counters 174–176, the error rate can be determined for each type of error. In an alternative embodiment the fields 174–176 are 1 bit fields that flag the occurrence of the respective error.

Figure 9:
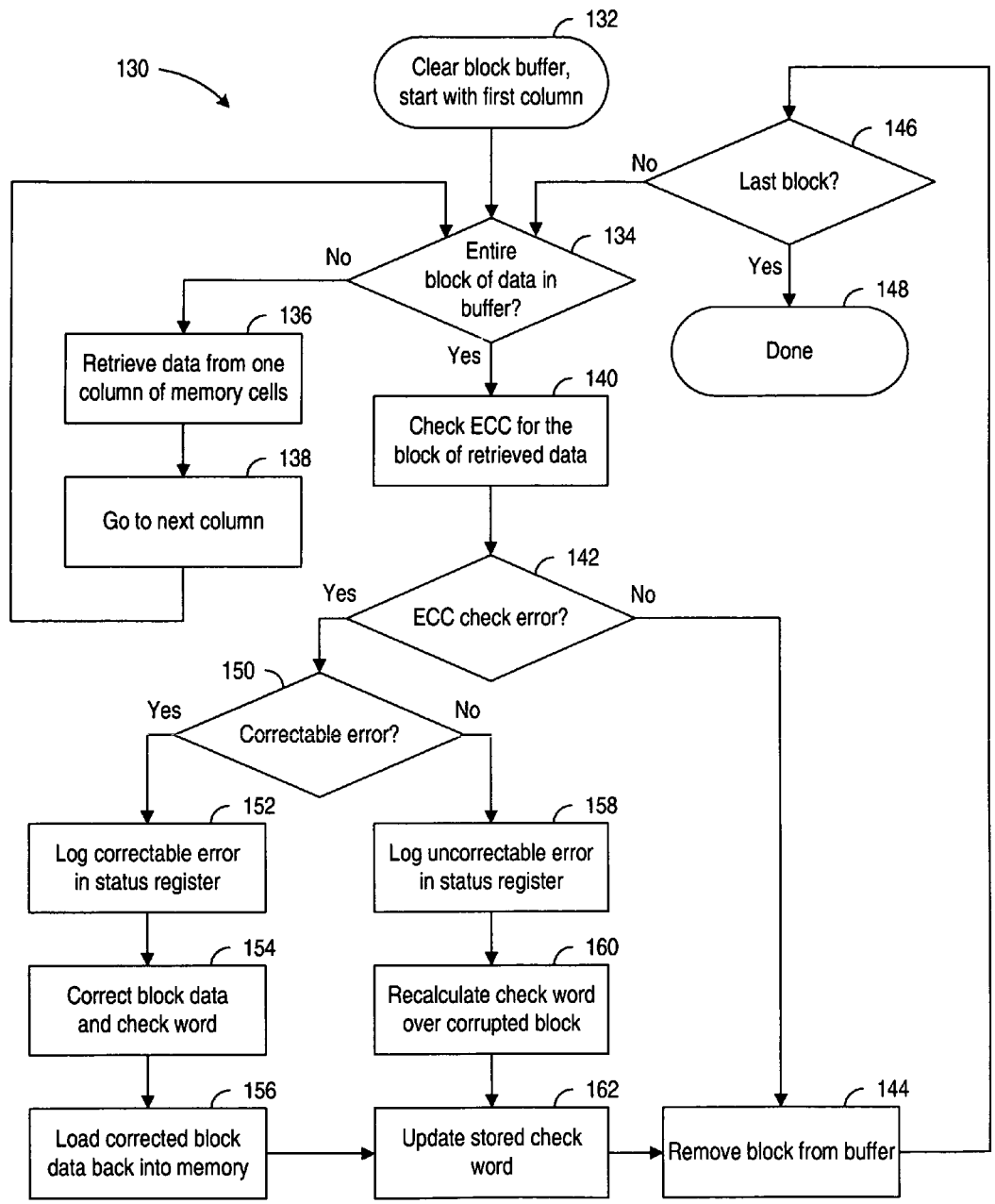
FIG. 9 is a flow chart of an example process for correcting configuration errors in accordance with various embodiments of the present invention.

FIG. 9 is a flow chart of an example process 130 for correcting configuration errors in accordance with various embodiments of the present invention. In step 132 the buffer 170 is cleared and the address module 16 is set to start at the first column. At step 134 a check is made to determine whether more frame data must be retrieved because the buffer 170 of ECCC 13 does not yet contain an entire data block. When there is insufficient data in the buffer 170, the process proceeds to step 136 to have the configuration module 18 retrieve a column of data from memory cells 14. In one embodiment, this data is loaded into frame register 11, although another register (inside or outside of ECCC 13) may be used.

The retrieved data in frame register 11 is sent to buffer 170 of ECCC 13. After a frame is retrieved, at step 138 the address module 16 is advanced to the next column. ECCC 13 can access data in check memory 19, which contains the check word associated with each block. In step 140 once a block is available the block is checked for any errors with an ECC by checker 171 of ECCC 13. At step 142, in the case when no error is detected, the process advances to step 144 to remove the block from buffer 170, and then the process checks whether all of configuration memory has been checked at step 146. While there is more configuration memory to check, the process iterates at step 134, otherwise checking is complete at step 148.

When there is an error at step 142, the process advances to step 150 to check on the error classification determined by correction logic 172. For some ECC, all detectable errors are correctable error so in these cases the process always advances to step 152. At step 152 the correctable error is logged in field 174 of status register 21.

At step 154 the correction logic 172 corrects the error, and at step 156 the corrected block is sent to the buffer 170 and the corrected block data is returned to configuration memory by the configuration module 18. The corrected check word is also returned to check memory 19 at step 162. At step 150, when the detected error is an uncorrectable error, the process advances to step 158 where the uncorrectable error is logged in field 175 of status register 21. Typically an uncorrectable error is treated by configured user logic as a fatal error that causes the FPGA system to be reset. However, in some cases the FPGA system must continue even with the uncorrectable error. One example is when an error rate for uncorrectable errors needs to be measured. In one embodiment to allow the next error to be detected at step 160 the current uncorrectable error is masked by recalculating the check word over the corrupted data. At step 162 this recalculated check word is written into check memory 19.

The checking of configuration memory can be done continuously, periodically, or in response to a detected error as is later discussed in detail.

In an embodiment of the present invention, the ECC can be used to correct a single bit of error in a data block of memory cells 14. In other embodiments of the invention, several bits of errors can be corrected, or several bits of errors can be corrected and additional bits of errors can be detected. It should be noted that the size of storage 19 needs to be increased or a longer block ECC must be used if there is a need to correct multiple bits in a column. Many error correcting codes and circuits have been disclosed in various publications (e.g., J. Wakerly, "Error Detecting Codes, Self-Checking Circuits and Applications," Elsevier North-Holland, N.Y., 1978), and they can be used in the present invention. The codes include BCH, Reed-Solomon, and turbo codes.

In one embodiment of the present invention, the error check words may be generated on-chip. In this embodiment, configuration module 18 copies the data in frame register 11 to checker 171 of ECCC 13 when the data is first loaded into frame register 11 during configuration. ECCC 13 computes the error check words, and stores the check words into corresponding locations in check memory 19. In another embodiment, the error check words are generated off-chip. These check words are integrated into the configuration bitstream, and delivered to the FPGA during power up. In this case ECCC 13 merely retrieves the error check words from the bitstream, and stores the bits into appropriate locations in check memory 19.

Figure 10:
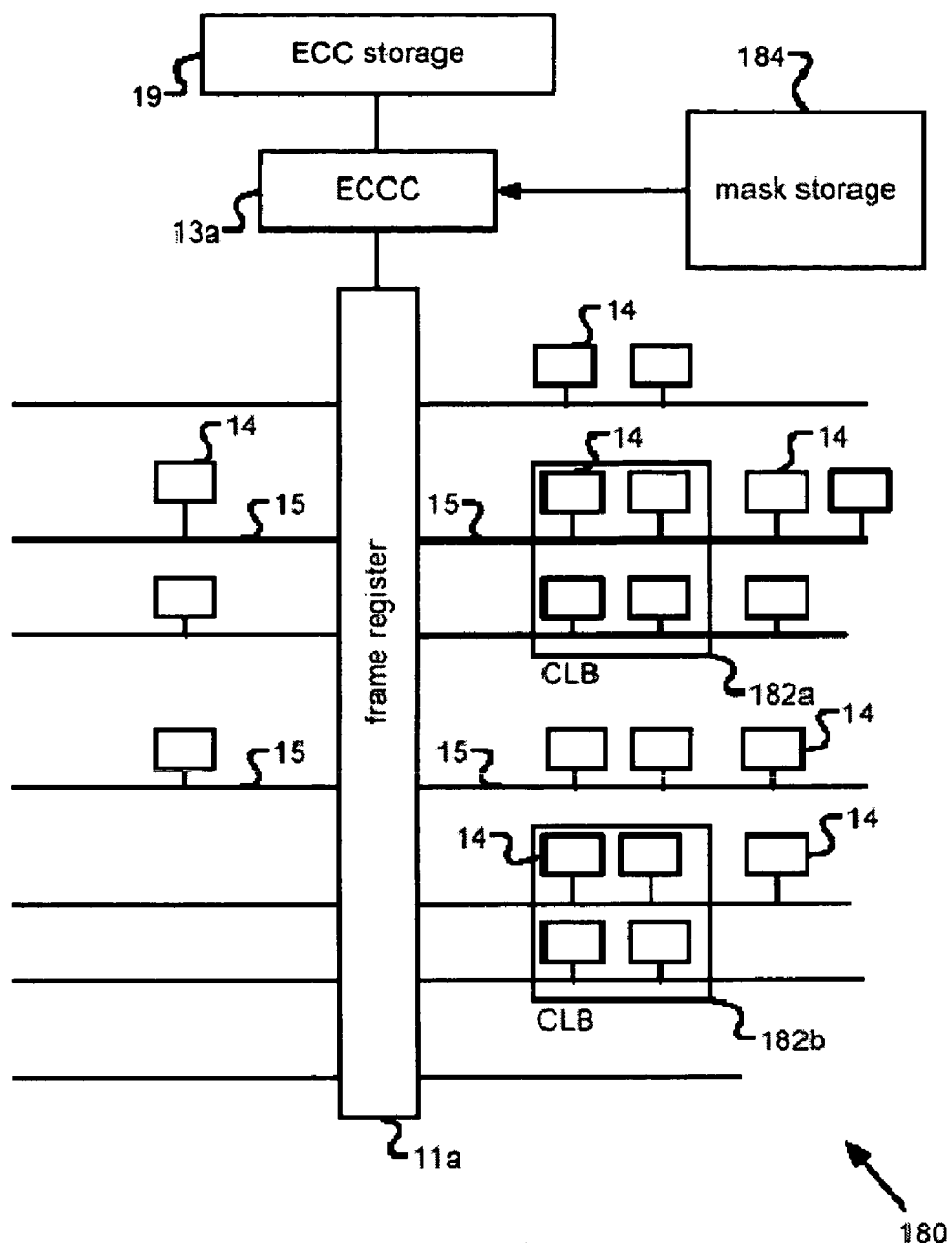
FIGS. 10, 11, and 12 show different systems capable of handling components that may by-design change state after configuration and under normal operation.

It will be recognized that the states of some of the components in a CLB may change after configuration during normal operation. Examples of such components are flip-flops and random access memory. FIG. 10 shows a system 180 that addresses this issue. Elements in FIGS. 2 and 10 that are similar have the same reference numerals. System 180 contains a frame register 11*a* that reads back the states of CLBs (such as 182*a* and 182*b*). The data in frame register 11*a* is delivered to an error correcting code circuit 13*a*. Circuit 13*a* reads data stored in a mask storage 184, which stores information that indicates which bits in the CLBs may intentionally change during operation. The error correction algorithm is performed on the frame data with these variable bits masked by substituting 0 or other constant data for these bits. Since the CLB configuration typically spans several frames, the location of the masked bits will be different from frame to frame, but repeating regularly. Similarly, since each frame contains data from several CLBs, the mask data may represent a single CLB and the ECC circuit 13*a* repeats the mask for each CLB in the frame. As a result, the computation of the error check will not be affected by the changed states.

Data in mask storage 184 can be set up using several methods. The data can be stored in mask-programmed read-only memory on chip because the locations of the potentially-changeable parts are known in advance. The data can also be included in the bitstream, and loaded into writable memory on chip. In the situation where it is not desirable to include the complete mask data in the bitstream, the bitstream could include an indicator on a CLB-by-CLB basis on whether or not to use the mask. For example, the bitstream could turn on the mask for those LUTs that are used as memory, while leaving the others unchanged (and therefore correctable).

Figure 11:
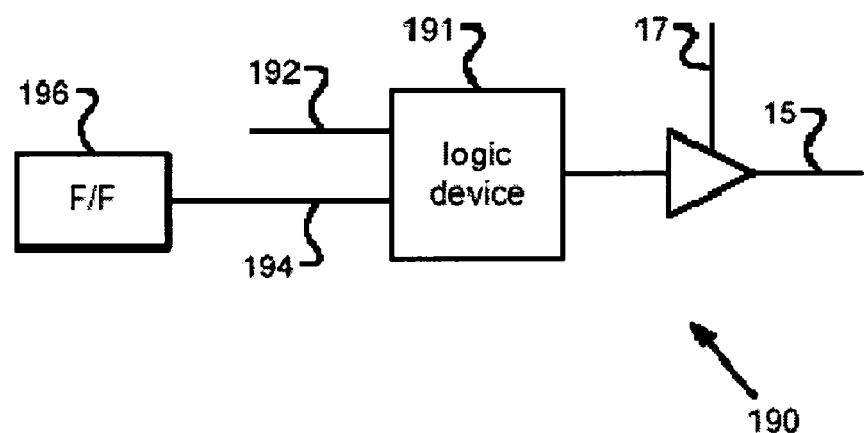

Another way to solve this problem is shown in a system 190 of FIG. 11. The error correcting code circuit contains a logic device 191 (such as an AND gate) having an input terminal 194 connected to one of the above-mentioned components of a CLB (such as a flip-flop 196), the state of which may change after configuration. Another input terminal 192 of logic device 191 is connected to a signal that indicates whether the state of flip-flop 192 has been intentionally changed after configuration. If the state has been intentionally changed, logic device 191 will shield the change from the error correcting code circuit. Alternatively, terminal 192 can be a signal that indicates the bit is permitted to change during operation. This signal may be determined from other configuration bit settings such as enabling LUT Ram mode.

Figure 12:
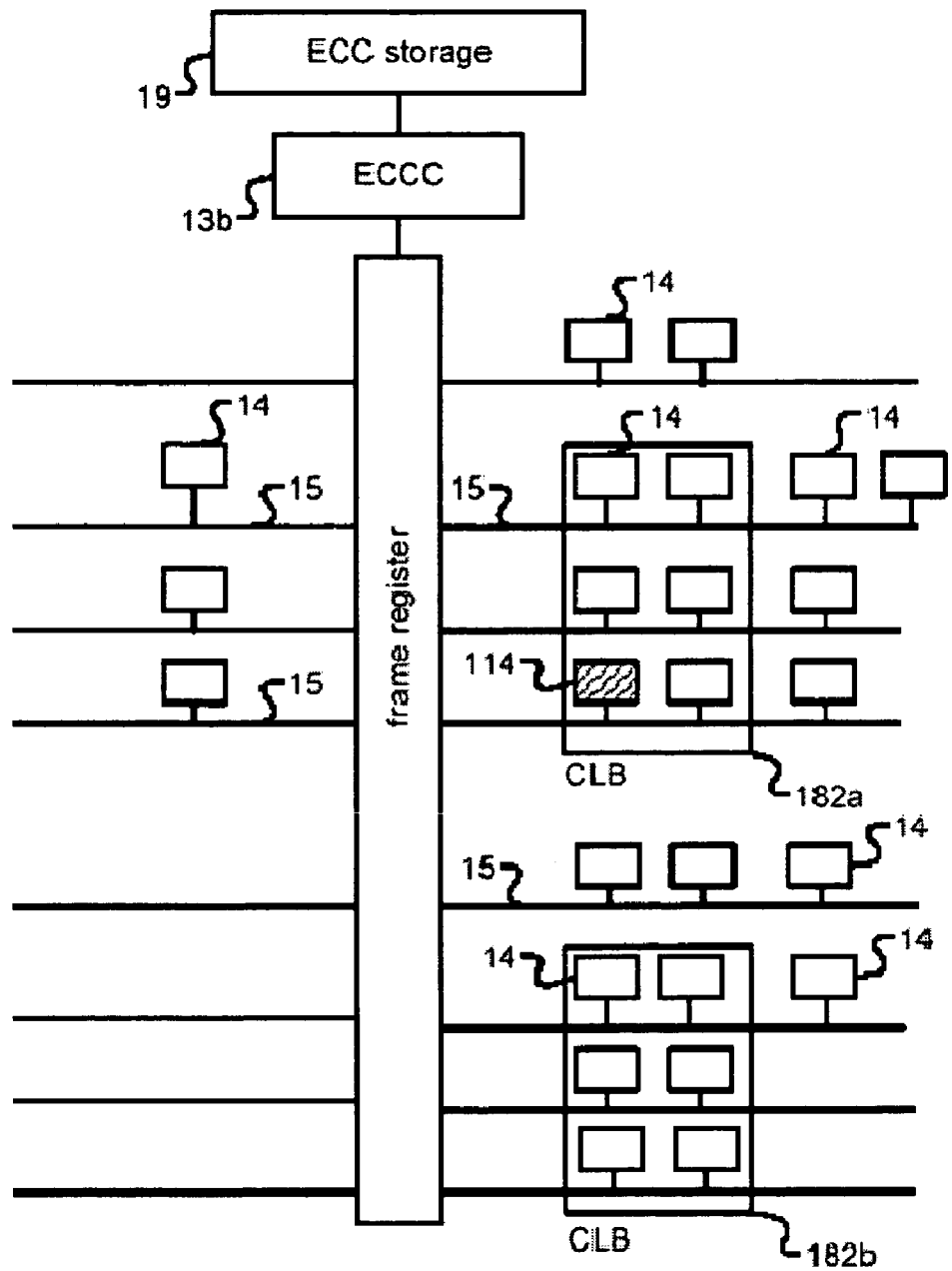

In yet another embodiment (FIG. 12), the CLB contains additional bits 114 that read back the values that indicate which bits may change during configuration. ECCC 13b contains the logic device that clears the appropriate variable bits in the bitstream before computing the error check.

It is important to note that in addition to preventing variable bits from being read back, the FPGA must also prevent these bits from being written when an error is being corrected. The same signals are used to either prevent new values from being driven on data bus 15 or by preventing the variable memory cells from being addressed and hence overwritten.

Figure 13:
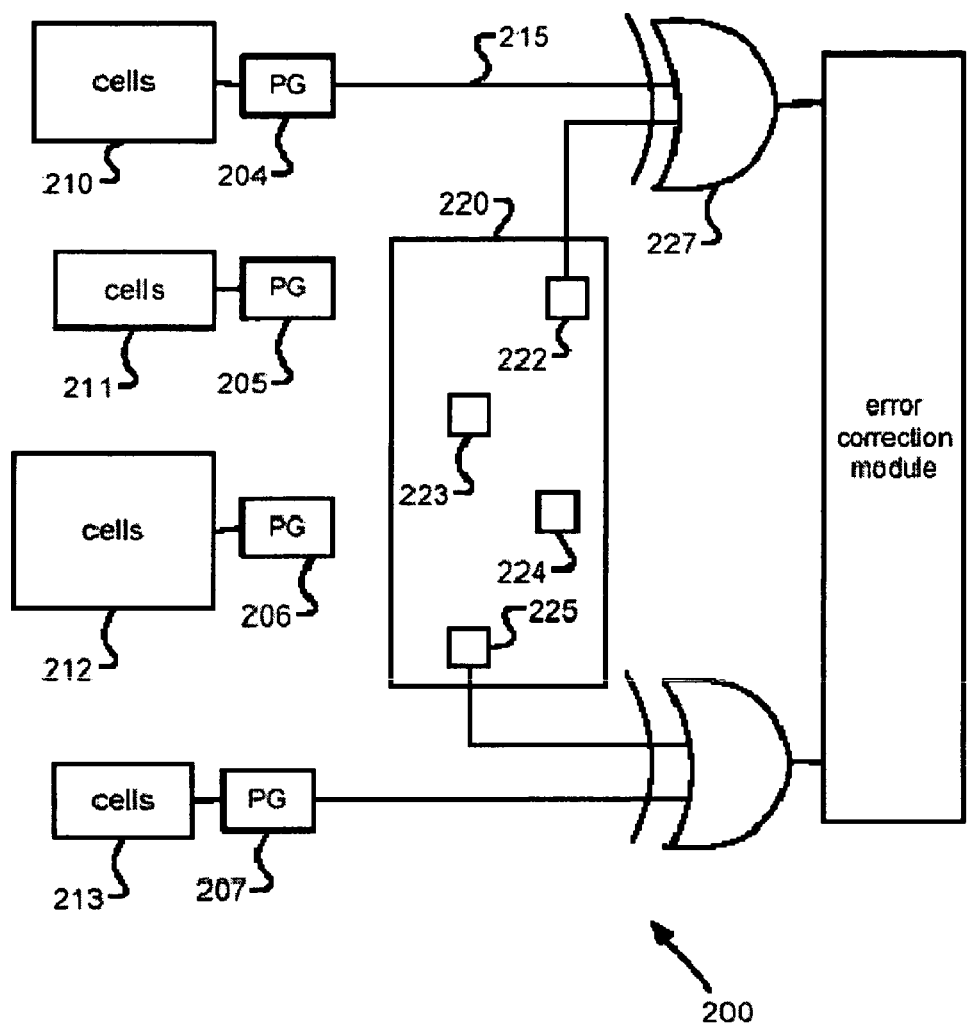
FIG. 13 is a schematic diagram of a parity based error detection system of the present invention.

A different embodiment that provides error detection and correction is now described. This embodiment uses at least one parity bit to represent the correct state of memory cells. A change in any parity bit triggers error correction actions. FIG. 13 is a schematic diagram of a parity based error correction system 200 of the present invention. System 200 comprises a plurality of parity bit generators, such as generator 204–207, that generate parity bits of selected combinations of memory cells (e.g., one or more frames or subsets of a frame), such as combinations 210–213. The parity bits computed from the original configuration bits of the corresponding combinations are stored in registers of an on-chip storage 220. For example, the parity bits of combinations 210–213 are stored in registers 222–225, respectively. The output of a parity bit generator and the corresponding parity bit stored in storage 220 are coupled to separate inputs of a XOR gate (or, in some situations, a XNOR gate). When there is a change in one of the memory cells connected to parity bit generator 204, the output of generator 204 changes state. This will immediately trigger action to correct the error. As a result, there is almost no delay. One advantage of this embodiment is that there is no need to use address module 16 and configuration module 18 to periodically or continuously check memory cells 14.

In one embodiment of the present invention, the trigger will cause the configuration bits of the corresponding frame(s) or subset of a frame to be reloaded from external memory. The correct data is loaded into the corresponding memory cells. In another embodiment of the present invention, ECCC 13 and error check memory 19 can be used in combination with error correction system 200. The error check words stored in check memory 19 are retrieved to reconstruct the original bits. As a result, there is no need to rely on an external memory.

Parity bits are used to detect an odd number of bit changes in a combination of memory cells. It should be noted that other error detection codes (and the corresponding error detection circuits) may also be used to detect other types of bit changes.

Note that not all bits need to be included in a parity chain. For example, the bits that are permitted to change during normal operation of the FPGA can be omitted.

It can be seen from the above description that a novel error correction system and methods for implementing the same have been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

We claim:

1. An error correction system for a programmable logic device (PLD), comprising:
   a frame circuit arranged to retrieve data from each column of configuration memory of the PLD;
   a check memory for storage of a plurality of check words;
   a buffer circuit coupled to the check memory and to the frame circuit, the buffer circuit arranged to assemble blocks of data from data retrieved by the frame circuit and from corresponding check words in the check memory;
   a mask memory specifying variant memory cells of the configuration memory, wherein a value in a variant memory cell is permitted to vary during operation of the PLD; and
   a mask circuit coupled to the mask memory and to the buffer circuit and arranged to substitute in the blocks of data a constant value for the value of each variant memory cell;
   a plurality of storage elements; and
   a check circuit coupled to the plurality of storage elements and to the buffer circuit, the check circuit arranged to check each block with an error correcting code and store data indicating detected errors in the plurality of storage elements.

2. The system of claim 1, further comprising:
   a correction circuit coupled to the check circuit and to the frame circuit, the correction circuit arranged to correct each block found by the check circuit to have an error;
   wherein the frame circuit is further arranged to update the configuration memory with a corrected block of data; and
   wherein the mask circuit is further arranged to inhibit modification of the value of variant memory cells during updates to the configuration memory with a corrected block of data.

3. The system of claim 2, wherein the correction circuit is further arranged to update the check memory for the check word corresponding to a block corrected by the correction circuit with a corrected check word for the block.

4. The system of claim 3, wherein the block ECC is a turbo code.

5. The system of claim 3, further comprising:
   wherein the check circuit is further arranged to calculate a syndrome from the block using a parity check matrix for the block error correcting code and detect a block error from a non-zero syndrome;
   wherein the check circuit is further arranged to determine from the syndrome whether a detected error is a correctable error or an uncorrectable error; and
   wherein the correction circuit is further arranged to correct a block error that is determined to be a correctable error using the syndrome.

6. The system of claim 5, wherein the block ECC is a Bose-Chaudhury-Hocquenghem (BCH) code.

7. The system of claim 6, wherein the BCH code is a 511/528 BCH code.

8. The system of claim 5, wherein the block ECC is a Reed-Solomon code.

9. The system of claim 5, wherein the data stored in the plurality of storage elements by the check circuit indicates whether a detected block error is a correctable error or an uncorrectable error.

10. The system of claim 9, wherein the check circuit is further arranged to indicate in the plurality of storage elements respective numbers of detected correctable errors and detected uncorrectable errors.

11. The system of claim 1, wherein the check circuit is further arranged to compare a check word from check memory with a check word recalculated from a corresponding block of data, and a difference in comparison indicates a block error.

12. The system of claim 1, wherein the check circuit is further arranged to calculate a syndrome from a block using a parity check matrix for a block error correcting code, and a non-zero syndrome indicates a block error.

13. The system of claim 1, wherein the check memory is a portion of the configuration memory.

14. The system of claim 1, wherein the check circuit is further arranged to periodically check for errors in configuration memory.

15. The system of claim 1, wherein the frame circuit, check memory, buffer circuit, plurality of storage elements, and check circuit are arranged in a single integrated circuit.

16. A method for detection and correction of errors in configuration data of a programmable logic device (PLD), comprising:
   retrieving data from each column of configuration memory of the PLD;
   specifying variant memory cells of the configuration memory in a mask memory, wherein a value in a variant memory cell is permitted to vary during operation of the PLD;
   assembling blocks of data from configuration data retrieved from the columns of configuration memory and from corresponding check words in a check memory;
   substituting in the blocks of data a constant value for the value of each variant memory cell;
   checking each block with an error correcting code; and
   storing data indicative of detected errors in a plurality of storage elements in the PLD.

17. The method of claim 16, further comprising:
   correcting configuration data in each block found to have an error;
   updating the configuration memory with a corrected block of data; and
   inhibiting modification of the value of variant memory cells during updates to the configuration memory with corrected blocks of data.

18. The method of claim 17, further comprising updating the check memory having the check word corresponding to a corrected block with a corrected check word for the corrected block.

19. The method of claim 18, wherein the block ECC is a turbo code.

20. The method of claim 18, further comprising:
   calculating a syndrome from the block using a parity check matrix for the block error correcting code and detecting a block error from a non-zero syndrome;
   determining from the syndrome whether a detected error is a correctable error or an uncorrectable error; and
   correcting a block error that is determined to be a correctable error using the syndrome.

21. The method of claim 20, wherein the block ECC is a Bose-Chaudhury-Hocquenghem (BCH) code.

22. The method of claim 21, wherein the BCH code is a 511/528 BCH code.

23. The method of claim 20, wherein the block ECC is a Reed-Solomon code.

24. The method of claim 20, wherein the data stored in the plurality of storage elements indicates whether a detected block error is a correctable error or an uncorrectable error.

25. The method of claim 24, further comprising indicating in the plurality of storage elements respective numbers of detected correctable errors and detected uncorrectable errors.

26. The method of claim 16, further comprising comparing a check word from check memory with a check word recalculated from a corresponding block of data, wherein a difference in comparison indicates a block error.

27. The method of claim 16, further comprising calculating a syndrome from a block using a parity check matrix for a block error correcting code, wherein a non-zero syndrome indicates a block error.

28. The method of claim 16, wherein the check memory is a portion of the configuration memory.

29. The method of claim 16, further comprising periodically performing the steps to retrieving, assembling, checking, and storing.

* * * * *